(12) United States Patent
Appenzeller et al.

(10) Patent No.: US 9,190,135 B2
(45) Date of Patent: Nov. 17, 2015

(54) ORGANIC FERROELECTRIC MATERIAL BASED RANDOM ACCESS MEMORY

(75) Inventors: Joerg Appenzeller, West Lafayette, IN (US); Saptarshi Das, West Lafayette, IN (US)

(73) Assignee: PURDUE RESEARCH FOUNDATION, West Lafayette, IN (US)

( * ) Notice: Subject to any disclaimer, the term of this patent is extended or adjusted under 35 U.S.C. 154(b) by 6 days.

(21) Appl. No.: 13/566,830

(22) Filed: Aug. 3, 2012

(65) Prior Publication Data

US 2012/0314476 A1    Dec. 13, 2012

Related U.S. Application Data

(63) Continuation-in-part of application No. 13/459,842, filed on Apr. 30, 2012, now abandoned.

(60) Provisional application No. 61/480,937, filed on Apr. 29, 2011.

(51) Int. Cl.
| | |
|---|---|
| *G11C 11/22* | (2006.01) |
| *B82Y 10/00* | (2011.01) |
| *H01L 21/28* | (2006.01) |
| *H01L 29/51* | (2006.01) |
| *H01L 29/66* | (2006.01) |
| *H01L 27/115* | (2006.01) |
| *H01L 29/06* | (2006.01) |
| *H01L 29/78* | (2006.01) |

(52) U.S. Cl.
CPC ............... *G11C 11/22* (2013.01); *B82Y 10/00* (2013.01); *H01L 21/28291* (2013.01); *H01L 27/1159* (2013.01); *H01L 29/0669* (2013.01); *H01L 29/516* (2013.01); *H01L 29/6684* (2013.01); *H01L 29/78391* (2014.09)

(58) Field of Classification Search
CPC ............. G11C 11/223; G11C 11/2273; G11C 11/2275
USPC ................ 365/145, 149, 150; 257/295; 348/3
See application file for complete search history.

(56) References Cited

U.S. PATENT DOCUMENTS

| | | | | |
|---|---|---|---|---|
| 5,515,311 | A * | 5/1996 | Mihara | 365/145 |
| 5,850,091 | A * | 12/1998 | Li et al. | 257/316 |
| 5,889,699 | A * | 3/1999 | Takano | 365/185.18 |
| 6,240,013 | B1 * | 5/2001 | Nishimura | G11C 14/00 365/145 |
| 6,392,920 | B2 * | 5/2002 | Fujimori | 365/145 |
| 8,120,082 | B2 * | 2/2012 | Park | G11C 11/22 257/295 |
| 8,304,823 | B2 * | 11/2012 | Boescke | G11C 11/22 257/295 |

OTHER PUBLICATIONS

Chen et al.; Mobility Extraction and Quantum Capacitance Impact in High Performance Graphene Field-effect Transistor Devices; Electron Devices Meeting, 2008. IEDM 2008. IEEE International.

(Continued)

*Primary Examiner* — Andrew Q Tran
(74) *Attorney, Agent, or Firm* — Purdue Research Foundation

(57) ABSTRACT

Illustrative embodiments provide a FETRAM that is significantly improved over the operation of conventional FeRAM technology. In accordance with at least one disclosed embodiment, a CMOS-processing compatible memory cell provides an architecture enabling a non-destructive read out operation using organic ferroelectric PVDF-TrFE as the memory storage unit and silicon nanowire as the memory read out unit.

10 Claims, 5 Drawing Sheets

(56) References Cited

OTHER PUBLICATIONS

Cui et al.; Functional Nanoscale Electonic Devices Assembled Using Silicon Nanowire Building Blocks; Science; Feb. 2, 2001; pp. 851-853; vol. 291.

Cui et al.; High Performance Silicon Nanowire Field Effect Transistors; Nano Letters; 2003; pp. 149-152; vol. 3, No. 2.

Frank et al.; Carbon Nanotube Quantum Resistors; Science; Jun. 12, 1998; pp. 1744-1746; vol. 280.

Fujisaki; Current Status of Nonvolatile Semiconductor Memory Technology; Japanese Journal of Applied Physics; 2010; pp. 1-14; vol. 49, No. 100001.

Horiuchi et al.; Above-room-temperature ferroelectricity in a single-component molecular crystal; Nature; Feb. 11, 2010; pp. 789-792; vol. 463.

Kang et al.; Spin cast ferroelectric beta poly(vinylidene fluoride) thin films via rapid thermal annealing; Applied Physics Letters; 2008; pp. 1-3; vol. 92, No. 012921.

Kohlstedt et al.; Current status and challenges of ferroelectric memory devices; Microelectronic Engineering; 2005; pp. 296-304; vol. 80.

Lee et al.; Flexible low voltage nonvolatile memory transistors with pentacene channel and ferroelectric polymer; Applied Physics Letters; 2009; pp. 1-3; vol. 94; No. 093304.

Lei et al.; Nanowire transistors with ferroelectric gate dielectrics: Enhanced performance and memory effects; Applied Physics Letters; 2004; pp. 4553-4555; vol. 84, No. 22.

Liao et al.; Ferroelectric Transistors with Nanowire Channel: Toward Nonvolatile Memory Applications; ACS Nano; 2009; pp. 700-706; vol. 3, No. 3.

Mathews et al.; Ferroelectric Field Effect Transistor Based on Epitaxial Perovskite Heterostructures; Science; Apr. 11, 997; pp. 238-240; vol. 276.

Moazzami; Ferroelectric thin film technology for semiconductor memory; Semicond. Sci. Technol.; 1995; pp. 375-390; vol. 10.

Pavan et al.; Flash Memory Cells—An Overview; Proceedings of the IEEE; Aug. 1997; pp. 1248-1271; vol. 85, No. 8.

Scott; Applications of Modern Ferroelectrics; Science; Feb. 16, 2007; pp. 954-959; vol. 315.

Shur; Kinetics of ferroelectric domains: Application of general approach to LiNbO3 and LiTaO3; Journal of Materials Science; 2006; pp. 199-210; vol. 41.

Singh et al.; High-Performance Fully Depleted Silicon Nanowire (Diameter < 5 nm) Gate-All-Around CMOS Devices; IEEE Electron Device Letters; May 2006; pp. 383-386; vol. 27, No. 5.

Valasek; Piezo-Electric and Allied Phenomena in Rochelle Salt; Physical Review; 1921; pp. 475-481; vol. 17; No. 4.

\* cited by examiner

Figure 1: Prior Art

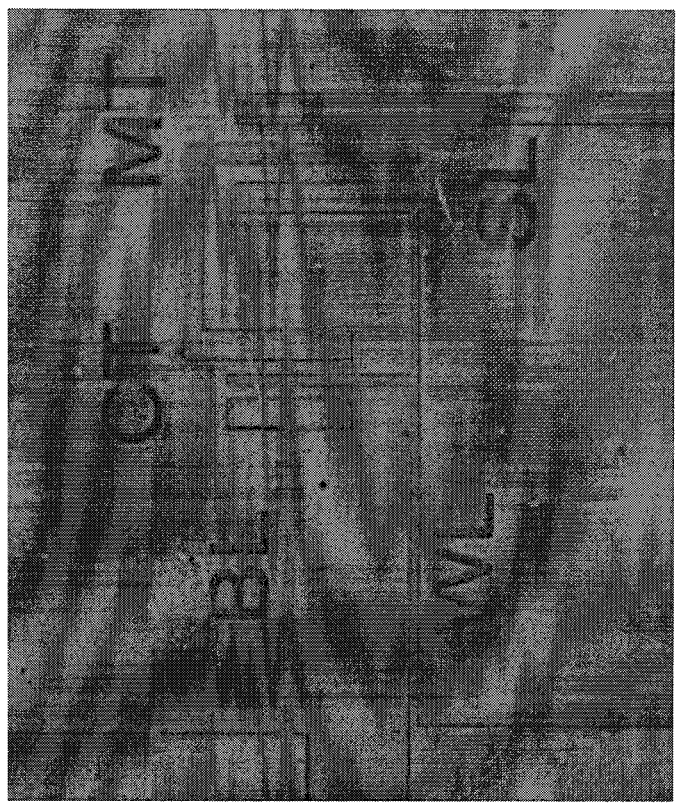
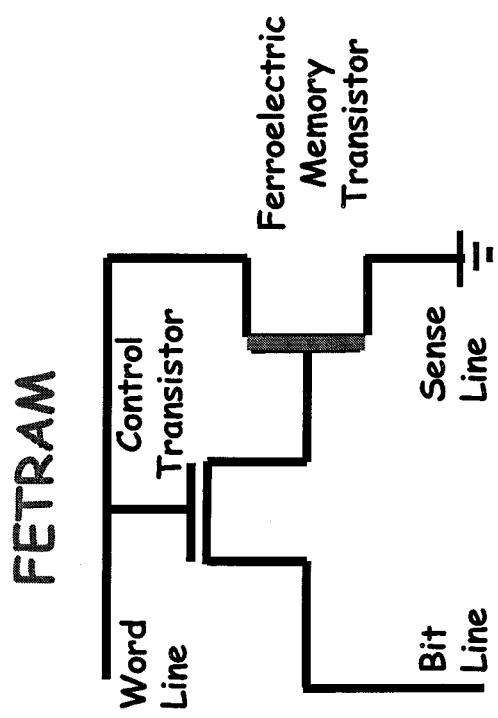
Figure 3 (A)
Figure 3 (B)

ORGANIC FERROELECTRIC MATERIAL BASED RANDOM ACCESS MEMORY

PRIORITY INFORMATION

The present application claims priority to U.S. Prov. Appl. 61/480,937, filed on Apr. 29, 2011 and entitled "ORGANIC FERROELECTRIC MATERIAL BASED RANDOM ACCESS MEMORY," and U.S. patent application Ser. No. 13/459,842, filed Apr. 30, 2012 (the $29^{th}$ being a Sunday) and entitled "ORGANIC FERROELECTRIC MATERIAL BASED RANDOM ACCESS MEMORY," which are incorporated by reference in their entirety.

GOVERNMENT RIGHTS

This invention was made with government support under Grant No. EEC-0634750 awarded by the National Science Foundation. The U.S. Government has certain rights in the invention.

TECHNICAL FIELD

The present disclosure relates, generally, to Non-Volatile Random Access Memory (NVRAM) architectures and, more particularly, to an NVRAM architecture employing a novel combination of organic ferroelectric copolymer and silicon nanowire. It also demonstrates a novel memory cell circuit layout.

BACKGROUND

High performance personal computers, mobile phones, smart cards, gaming stations have become essential parts of everyday human life. The day is not too distant when one unified device will provide everything from high speed Internet and personal banking to transport access and medical data. The market for high speed, high density, low power, and endurable NVRAM has been drastically increased over the last few decades. It is not astonishing that a number of different NVRAM technologies co-exist to fulfill all requirements.

Ferroelectric materials naturally lend themselves toward binary code based NVRAM applications as they possess two stable spontaneous polarization states, which can only be switched by the application of an external electric field E which is greater than the coercive field $E_C$. Ferroelectric switching, assisted by domain nucleation and domain wall motions, is intrinsically very fast and hence can be employed for GHz speed memory operations. The state of art commercially available One Transistor One Capacitor (1T1C) Ferroelectric RAM (FeRAM) holds only a relatively small part of the overall semiconductor market-share compared to commercially available FLASH memory. This is in part due to conventional FeRAM's destructive read out and limited integration flexibility; these deficiencies appear to outweigh the benefits of FeRAM's higher speed and longer endurance.

SUMMARY

Disclosed embodiments encompass a CMOS-processing compatible (by CMOS compatibility we mean 1. The ferroelectric copolymer can be spun on silicon substrate/silicon nanowire to form a uniform film 2. Top gated device geometry can be fabricated for individual gating of the devices, using standard lithographic techniques.) memory cell that provides an architecture enabling a non-destructive read out operation using organic ferroelectric PVDF-TrFE as the memory storage unit and silicon nanowire as the memory read out unit.

Disclosed embodiments provide a fabricated 1T1T ferroelectric memory cell that has the potential to extend the application space for FeRAM family to high speed, low power, high density data storage applications with high endurance.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity.

FIG. 3(A) illustrates one embodiment of the novel FETRAM cell provided in accordance with the disclosure.

FIG. 3(B) provides an optical image of a fabricated FETRAM memory cell.

DETAILED DESCRIPTION

Figure 1:
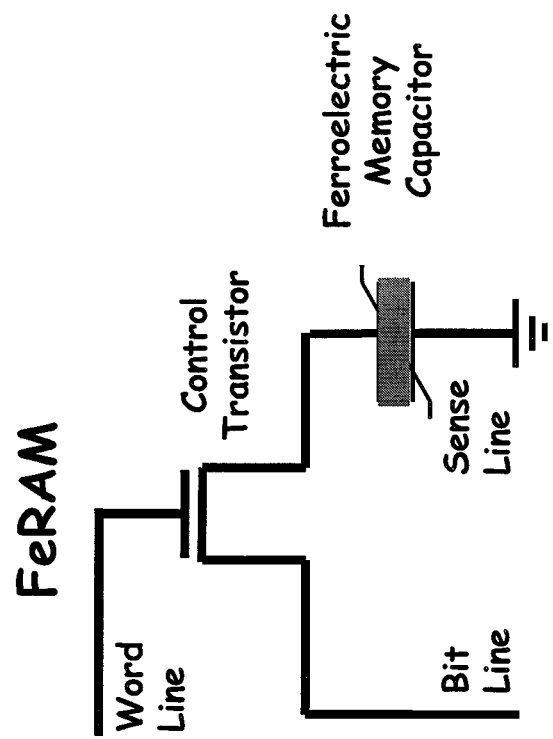
FIG. 1 illustrates a conventional Ferroelectric RAM cell.

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives consistent with the present disclosure and appended claims.

References in the specification to "one embodiment," "an embodiment," "an illustrative embodiment," etcetera, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In the drawings, specific arrangements or orderings of schematic elements may be shown for ease of description.

However, it should be understood by those skilled in the art that the specific ordering or arrangement of the schematic elements in the drawings is not meant to imply that a particular order or sequence of processing, or separation of processes, is required. Further, the inclusion of a schematic element in a drawing is not meant to imply that such element is required in all embodiments or that the features represented by such element may not be included in or combined with other elements in some embodiments.

The present disclosure relates to applications for Ferroelectric materials (for a more detailed understanding of such materials and their characteristics see, J. Valasek et al., *Physical Review* 17, 475 (1921), incorporated herein by reference in its entirety). Such materials lend themselves toward binary code based NVRAM applications because the material posses two stable spontaneous polarization states, which can only be switched by the application of an external electric field E that is greater than a coercive field $E_C$.

Ferroelectric switching, assisted by domain nucleation (see, J. F. Scott, *Science*, 315, 954 (2007), incorporated by reference in its entirety) and domain wall motions (see, V. Shur et al., *Journal of Materials Science*, 41, 199 (2006), incorporated by reference in its entirety), is intrinsically very fast and hence can be employed for GHz speed memory operations.

Conventional One Transistor One Capacitor (1T1C) Ferroelectric RAM cells, as illustrated in FIG. 1, have one control transistor that enables the read/write operation and one ferroelectric capacitor that holds the information through its state of polarization.

To write the information in a conventional FeRAM cell (FIG. 1), the Word Line (WL) is activated to turn on the control transistor and the data is fed into the Bit Line (BL). To read the information, the WL is activated and the bit line forces the ferroelectric material into a particular polarization state. In order to read the information the BL is charged to a predefined voltage so that a current which is associated with the switching of the polarization in the memory capacitor is detected in the sense line (SL).

However, this process is destructive. As a result, the data written into the conventional FeRAM cell must be rewritten into the ferroelectric capacitor every time the read out operation is performed. This is a major drawback of conventionally available FeRAM technology and is a significant deficiency when competing with conventionally available FLASH memory technology (see, P. Pavan et al., *Proceedings of IEEE*, 85, 1248 (1997), incorporated by reference in its entirety).

However, the technological applications and commercial market for high speed, high density, low power and endurable Non-Volatile Random Access Memory (NVRAMs) has been drastically increased over the last few decades and it is not astonishing that a number of different NVRAM technologies co-exist to fulfill all requirements (see, Y. Fujisaki et al., *JJAP,* 49, 1 (2010), incorporated herein by reference in its entirety). However each technology comes with its own limitations and challenges the researchers to either find solutions or invent better alternatives.

Presently disclosed embodiments provide a ferroelectric material-based, fully functioning and novel NVRAM architecture, wherein a FETRAM (FErroelectric Transistor RAM) is utilized to address the above-noted deficiencies of conventional FeRAM technology.

A FETRAM is a unique combination of organic ferroelectric copolymer PVDF-TrEF and high performance silicon nanowire implemented in a top-gated, Ferroelectric Field Effect Transistor (FeFET) layout and incorporated in the presently disclosed, novel memory cell architecture.

As illustrated in FIG. 3A, at least one embodiment of the FETRAM overcomes the destructive read out problem faced by conventional FeRAMs by replacing the memory capacitor with a memory transistor. As a result, data is stored in the ferroelectric gate oxide of the transistor while the read out is performed by interrogating the conductance of the semiconducting channel of the transistor.

Ferroelectric memories in a transistor type layout with non-destructive read out operation have been conceptualized and reported by various groups using ferroelectric as the back gate oxide and non-silicon materials as the transport channel (see, S Mathews et al., *Science,* 276, 238 (1997), B. Lei et al., *Applied Physics Letters,* 84, 4553 (2004), L Liao et al., *ACS Nano,* 3, 700 (2009), and K. Lee et al., *Applied Physics Letters,* 94, 93304 (2009), each incorporated by reference in their entireties).

In accordance with at least one presently disclosed embodiment, the same concept is implemented but, for the first time, in a top gated structure; this implementation provides better electrostatic control with silicon nanowire as the channel material and making the device compatible to CMOS processing (see Y. Cui et al., *Science,* 291, 851 (2001) and Y. Cui et al., *Nano Letters,* 3, 149 (2003), each incorporated by reference in their entireties).

As a result, at least one implementation of the FETRAM cell addresses the conventional deficiency of providing non-destructive read out; additionally, the materials utilized in the FETRAM cell provide other benefits as well. For example, in at least one implementation, the organic ferroelectric PVDF-TrFE may have a low crystallization temperature (e.g., 200° C.). Therefore, the organic ferroelectric PVDF-TrFE may form a ferroelectric film on a semiconducting substrate without any chemical reaction, which is conventionally difficult to accomplish with crystalline ferroelectrics (e.g., PZT, BST etc).

Further, since the dielectric constant of PVDF-TrFE may be comparable to that of an interfacial layer formed during the crystallization process, most of the external switching voltage may be applied to the ferroelectric film (see S. Kang et al., *Applied Physics Letters,* 92, 12921 (2008), incorporated by reference in its entirety). This implementation, therefore, leads to improved stability of operation.

Moreover, organic ferroelectrics are relatively low cost materials with a relatively high degree of integratability because the material can be spun onto any substrate. By using 1-D silicon nanowires as the channel material for the read out operation, the resulting scaling and electrical performance is improved. This is because a 1-D wire allows better electrostatic gate control (see N. Singh et al., *IEEE Electron Device Letter,* Vol. 27, 383-386 (2006), incorporated by reference in its entirety) and has the potential to reach ballistic transport (see, S. Frank et al., *Science,* 280, 1744 (1998), incorporated by reference in its entirety).

FIG. 3A shows the operation principle of this novel architecture. Both the Control Transistor (CT) and the Memory Transistor (MT) are in depletion mode (i.e., normally On) when no external bias is applied to either the Word Line (WL) or Bit Line (BL). The Sense Line (SL) is always grounded.

To perform the Write operation, the WL is grounded to turn on the CT and an appropriate switching voltage ($V_{BL}$) is applied to the BL.

To perform the Read operation, the appropriate voltage is applied to the WL to turn off the control transistor and thereby disconnect the BL from the MT. Because the WL is also connected to the drain of the MT (the source being grounded)

a DC current is detected in the SL whose amplitude depends on the polarization state of the ferroelectric.

This Read Operation does not destroy the state of the ferroelectric in the gate oxide because the read out is performed by evaluating the channel current; as a result, a non-destructive read out operation is provided. It should be noted, however, that there will be an electrochemical potential inside the channel during the read out operation; however, its value is not enough to depolarize the ferroelectric layer if a proper scaling approach is utilized. Nevertheless, if the ferroelectric oxide thickness is scaled down to reduce the switching voltage and, as a result, the power consumption, then this depolarizing field can eventually switch the polarization state of the ferroelectric; as a result, this could potentially alter the read out operation to become a destructive one. Accordingly, it should be understood that the read out voltage should be maintained at a low level without compromising the amplitude of the sensing current.

As a result, there may be increased utility and value in implementing the CT using, for example, a ballistic high performance (154 µA/V/mode) channel material, e.g., silicon nanowire. However, scaling the read out voltage may also be effectively performed to ensure that the Control Transistor (CT) can be turned off with the specified voltage. Thus, improved electrostatic gate control may be required, which is much easier to realize using 1-D structures. Accordingly, the use of silicon nanowires for the CT is also particularly useful in an implementation. For the write operation, it is recommended to have a small potential drop across the MT. As a result, there may be increased utility and value in implementing the MT too using silicon nanowires.

Figure 2:
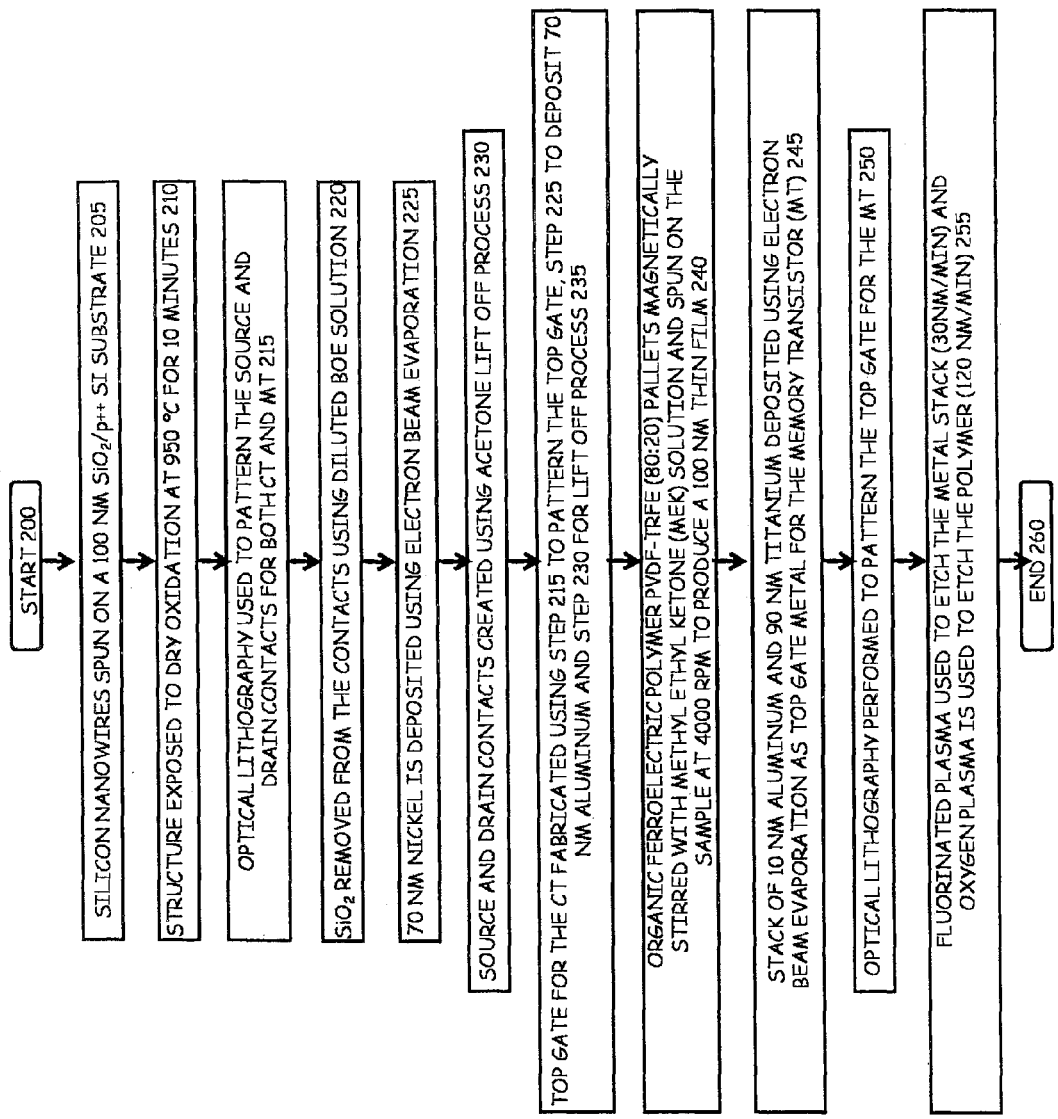
FIG. 2 is an illustrative diagram showing the process operations performed to fabricate a FETRAM cell in accordance with at least one disclosed embodiment.

In accordance with at least one disclosed embodiment, as illustrated in FIG. 2, manufacture of the novel FETRAM begins at 200 and proceeds to 205 at which silicon nanowires grown in a bottom-up CVD approach, are spun on a 100 nm $SiO_2/p^{++}$ Si substrate. It should be appreciated that utilization of the substrate enables back gating. Subsequently, at 210, the resulting structure is exposed to dry oxidation at 950° C. for 10 minutes. That oxidation results in a 4-6 nm cell of $SiO_2$ around the Si nanowire core of 90 nm and may be used as a top gate dielectric for the Control Transistor (CT).

Subsequently, at 215, optical lithography is used to pattern the source and drain contacts for both CT and MT (note that standard electron beam lithography techniques can also be implemented to design the source and the drain contacts). At 220, the $SiO_2$ is removed from the contacts using diluted BOE solution (BOE:$H_2O$=1:15, BOE is HF:$H_2O$=1:6). Control then proceeds to 225, at which 70 nm Nickel is deposited using electron beam evaporation; subsequently, at 230, conventional acetone lift off process is performed to create the source and drain contacts.

Further, at 235, the top gate for the CT is fabricated using the same techniques used for source and drain contacts. However the treatment in diluted BOE was avoided before the top gate metal evaporation. Aluminum was used as top gate metal for the CT. Subsequently, at 240, organic ferroelectric copolymer PVDF-TrFE (80:20) pallets, which may be obtained from Solvay, USA, may be magnetically stirred with Methyl Ethyl Ketone (MEK) solution (PVDF-TrFE=2% by volume) and spun on the sample at 4000 rpm to produce a 100 nm thin film. By adjusting either the composition of the solution or the spin rpm the thickness of the copolymer layer can be controlled.

Control then proceeds to 245, at which a stack of 10 nm aluminum and 90 nm titanium is deposited using electron beam evaporation as top gate metal stack for the Memory Transistor (MT).

At 250, optical lithography or the like may be used (instead of electron beam lithography) to pattern the top gate for the MT. Optical lithography may be a preferred technique for this operation due to the instability of the copolymer under high energy electron beam.

At 255, fluorinated plasma is used to etch the metal stack (30 nm/min) and oxygen plasma is used to etch the copolymer (120 nm/min). Control then proceeds to 260 at which operations for initial fabrication end.

The resulting fabricated memory cell and its optical image are illustrated in FIGS. 3(A) and 3(B).

The overlap between the source/drain metal contact and the top gate metal was intentionally avoided to reduce gate leakage (FIG. 3(B)).

Figure 4:
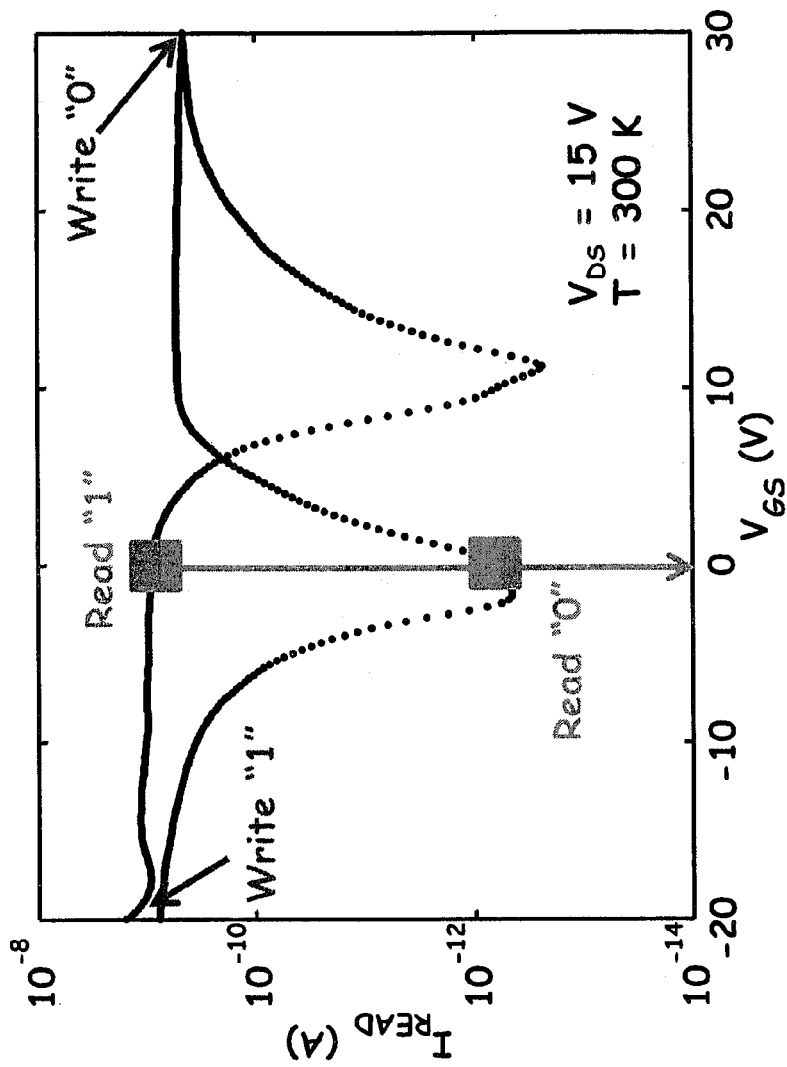
FIG. 4(A) includes a truth table indicating required voltage levels (High or Low) for operation of an FETRAM provided in accordance with at last one disclosed embodiment.
FIG. 4(B) includes a prototype transfer characteristics of the memory transistor for operation of an FETRAM provided in accordance with at last one disclosed embodiment.
FIG. 4(C) illustrates results of performing time domain measurements wherein, the Word Line (WL), Bit Line (BL) and Sense Line (SL) corresponding to two different back gate voltages in a FETRAM provided in accordance with at least one disclosed embodiment, wherein a Word Line, in an array of memory cells, is used to select a particular word which is being processed (read/write operation), a Bit Line, in an array of memory cells, is used to select a particular bit of the word which is being processed (mostly during write operation), and a Sense Line, in an array of memory cells, is used to determine the state of a particular bit of the word which is being processed (mostly during read operation).
Figure 4:
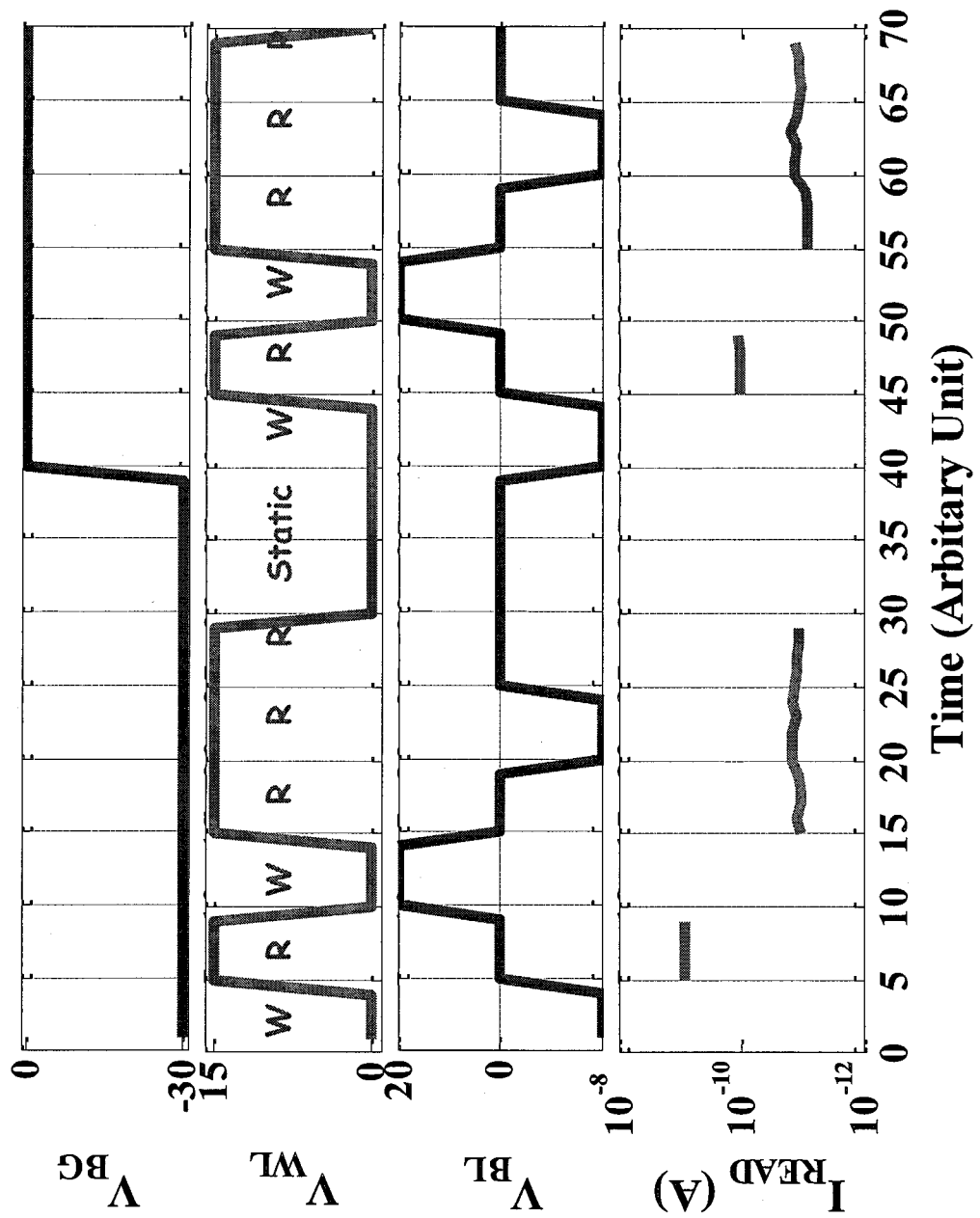

FIG. 4B shows the transfer characteristics of the memory transistor of the fabricated memory cell. Both electron and hole branches are present in the transfer characteristics. This is because of the ambipolar nature of the silicon nanowires used as channel material. Planar silicon can also be used for the device operation. The hysteresis in the transfer characteristics is a result of the ferroelectric gate oxide which is responsible for the memory property of the transistor.

It should be understood that the write operation cannot be performed during the read cycle and vice versa (owing to the required voltage levels as shown in the truth table, FIG. 4(A)). Accordingly, the read and the write operations are mutually exclusive and thereby improve the noise margin for the FETRAM cell.

FIG. 4(C) shows the voltage transitions for read and write operation cycles and the corresponding states of the Word Line (WL), Bit Line (BL) and Sense Line (SL) corresponding to two different back gate voltages. Based on the data illustrated in FIG. 4(C), it can clearly be confirmed that there is some utility using a back gate (or alternatively doping to provide its effect) to obtain a better memory ratio. Thus, test data confirms that the on-state conductance and memory ratio can be greatly enhanced by the use of a back gate or by doping in a FETRAM designed and fabricated in accordance with at least one disclosed embodiment. (see reference S. Das et. al, Nano Letters, Volume 11, 4003-4007 (2011), incorporated by reference in its entirety.)

As a result, the continually evolving and accelerating requirements for high performance, high density memories may be met by a FETRAM as described herein. As a result of the design operations, constraints and fabrication techniques and material selections discussed herein, disclosed embodiments may be provided that meet the increasingly stringent speed, cost, power, retentivity, endurance and stability requirements for commercial applications.

While this invention has been described in conjunction with the specific embodiments outlined above, it is evident that many alternatives, modifications and variations will be apparent to those skilled in the art. Accordingly, the various embodiments of the invention, as set forth above, are intended to be illustrative, not limiting. Various changes may be made without departing from the spirit and scope of the invention.

For example, although embodiments have been disclosed for a FETRAM that is significantly improved over the fabrication and operation of conventional FeRAM technology, it should be understood that the fabrication techniques and resulting structures and architecture also may be implemented in other high performance NVRAM technology. Thus, although the non-destructive read out feature provided by disclosed embodiments of the FETRAM enables the ability to compete with conventional FLASH memory architecture by providing faster access time, the disclosed embodiments extend to and encompass the use of silicon nanowire to effectively increase the packing density and the use of organic copolymer with low temperature processing and easier fabrication techniques to reduce the production cost. Furthermore, although the resulting high switching voltages increase power dissipation, thinner films enable the voltage to be scaled down to enable fabrication and operation of an organic FETRAM compatible with low power applications.

Accordingly, disclosed embodiments encompass a CMOS-processing compatible memory cell that provides an architecture enabling a non-destructive read out operation using organic ferroelectric PVDF-TrFE as the memory storage unit and silicon nanowire as the memory read out unit. The fabricated 1T1T ferroelectric memory cell has the potential to extend the application space for FeRAM family to high speed, low power, high density data storage applications with high endurance. The major challenge however is going to be the thickness scaling of the copolymer film to reduce the power requirements.

Additionally, it should be understood that the functionality described in connection with various described components of various invention embodiments may be combined or separated from one another in such a way that the architecture of the invention is somewhat different than what is expressly disclosed herein. Moreover, it should be understood that, unless otherwise specified, there is no essential requirement that methodology operations be performed in the illustrated order; therefore, one of ordinary skill in the art would recognize that some operations may be performed in one or more alternative order and/or simultaneously.

Various components of the invention may be provided in alternative combinations operated by, under the control of or on the behalf of various different entities or individuals.

Further, it should be understood that, in accordance with at least one embodiment of the invention, system components may be implemented together or separately and there may be one or more of any or all of the disclosed system components. Further, system components may be either dedicated systems or such functionality may be implemented as virtual systems implemented on general purpose equipment via software implementations.

As a result, it will be apparent for those skilled in the art that the illustrative embodiments described are only examples and that various modifications can be made within the scope of the invention as defined in the appended claims.

The invention claimed is:

1. A memory cell with non-destructive read out feature comprising:
    a control transistor; and
    a memory transistor, a drain of the memory transistor electrically connected to a gate of the control transistor, wherein a channel of the memory transistor comprises a semiconductor and a gate oxide of the memory transistor comprises a ferroelectric;
    wherein the control transistor is in depletion mode when no external bias is applied to either a word line or bit line for the memory cell with a sense line being grounded.

2. The memory cell of claim 1, wherein the memory transistor is implemented using the ferroelectric as a memory storage unit, the ferroelectric comprising an organic ferroelectric copolymer.

3. The memory cell of claim 2, wherein the organic ferroelectric copolymer is PVDF-TrFE.

4. The memory cell of claim 2, wherein the organic ferroelectric copolymer has a sufficiently low crystallization temperature to allow forming a ferroelectric film on a semiconducting substrate without any chemical reaction.

5. The memory cell of claim 1, wherein a memory read out unit of the memory cell is implemented using the channel of the memory transistor, the channel comprising a silicon nanowire or array of the same.

6. The memory cell of claim 5, wherein data read out operation is performed by interrogating the conductance of the channel of the memory transistor.

7. The memory cell of claim 1, wherein the memory cell is implemented as a top gated structure.

8. The memory cell of claim 1, wherein a process flow for fabricating the memory cell is CMOS-processing compatible.

9. A memory cell with non-destructive read out feature comprising:
    a control transistor; and
    a memory transistor, a drain of the memory transistor electrically connected to a gate of the control transistor, wherein a channel of the memory transistor comprises a semiconductor and a gate oxide of the memory transistor comprises a ferroelectric;
    wherein a write operation is performed by grounding a word line to turn on the control transistor and applying a switching voltage to a bit line and thereby changing a polarization state of the ferroelectric.

10. A memory cell with non-destructive read out feature comprising of:
    a control transistor; and
    a memory transistor, a drain of the memory transistor electrically connected to a gate of the control transistor, wherein a channel of the memory transistor comprises a semiconductor and a gate oxide of the memory transistor comprises a ferroelectric;
    wherein a read operation is performed by applying a voltage to a word line to turn off the control transistor and thereby disconnect a bit line from the memory transistor and detecting current in a sense line having an amplitude that depends on a polarization state of the ferroelectric.

* * * * *